(12) United States Patent
Saito

(10) Patent No.: US 6,291,270 B1
(45) Date of Patent: Sep. 18, 2001

(54) REVEALING LOCALIZED CUTTING LINE PATTERNS IN A SEMICONDUCTOR DEVICE

(75) Inventor: Takashi Saito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/398,767

(22) Filed: Sep. 17, 1999

(30) Foreign Application Priority Data

Sep. 28, 1998 (JP) .............................. P10-274094

(51) Int. Cl.$^7$ .................................. H01L 21/44
(52) U.S. Cl. .............................. 438/114; 438/106
(58) Field of Search .................. 438/110, 113, 438/114, 458, 459, 460, 462, 464, 465, 118, 119, 612, 613, 614

(56) References Cited

U.S. PATENT DOCUMENTS

| | | |
|---|---|---|
| 5,436,503 | 7/1995 | Kunitomo et al. . |
| 5,550,408 | 8/1996 | Kunitomo et al. . |
| 5,622,590 | 4/1997 | Kunitomo et al. . |
| 5,909,317 * | 6/1999 | Heo ........................................ 438/617 |
| 5,956,605 * | 9/1999 | Akram et al. ......................... 438/613 |
| 5,989,982 * | 11/1999 | Yoshiazu .............................. 438/462 |

* cited by examiner

Primary Examiner—David Nelms
Assistant Examiner—Dung A Le
(74) Attorney, Agent, or Firm—Sonnenschein, Nath & Rosenthal

(57) ABSTRACT

A method of production of a semiconductor device having bumps on its surface and having spaces between the bumps sealed by a resin capable of cutting a wafer accurately positioned to cutting lines giving a cutting margin on the wafer in a dicing step of the semiconductor device. On a semiconductor wafer 10 in which circuit patterns of semiconductor chips are formed in a first region and cutting lines 16 between semiconductor chips are formed extending across the first region and a second region, bumps are formed so as to be connected to the circuit patterns of the semiconductor chips, a resin coating 15 is formed on a bump forming surface of the semiconductor wafer to a predetermined thickness in the first region while sealing the spaces between the bumps and to a thickness enabling confirmation of positions of parts of the cutting lines in regions 16$a$ containing at least the parts of the cutting lines in the second region, and the semiconductor wafer is cut along the cutting lines using as reference positions the cutting lines confirmed in the regions containing at least the parts of the cutting lines in the second region.

8 Claims, 12 Drawing Sheets

REVEALING LOCALIZED CUTTING LINE PATTERNS IN A SEMICONDUCTOR DEVICE

BACKGROUND OF THE INVENTION

1. Field of the Invention

The present invention relates to a method of production of a semiconductor device, more particularly relates to a method of production of a semiconductor device of a package format made small in size and high in density.

2. Description of the Related Art

In the VSLI and other semiconductor devices of recent years, the size has been reduced by 70 percent in three years and higher integration and higher performance have been achieved. Along with this, the package format of semiconductor devices has been reduced in size and increased in density.

In the related art, as the package format of a semiconductor device, the DIP (Dual Inline Package) or PGA (Pin Grid Array) and other through hole mount devices (THD) for mounting by inserting lead wires into through holes provided in a printed circuit board and QFP (Quad Flat (L-Leaded) Package) or TCP (Tape Carrier Package) or other surface mount devices (SMD) for mounting by soldering lead wires to the surface of a board have been used. Further, the industry is shifting to package formats such as BGA (Ball Grid Array) packages forming output terminals in grid array state.

On the other hand, there have been rising demands for greater reduction of size and increase of density of semiconductor devices. These can no longer be met with the above QFP and other package formats. For this reason, attention has focused on the package format referred to as "chip size packages" (CSP, also referred to as "FBGA (Fine-Pitch BGA)") for realizing a further reduction of size and increase of density bringing the package size close to the size of the semiconductor chip as much as possible. Active study is now under way, and many proposals have been made.

An explanation will be made next of a semiconductor device of the above CSP format and a method for mounting it. For example, as shown in the sectional view of FIG. 1A, not illustrated electrode pads and a base board (interposer) 11 of a semiconductor chip 10a are mechanically and electrically connected by solder or other bumps 12. Further, the space between the semiconductor chip 10a and the base board 11 is filled and sealed by a sealing resin 13 for protecting the connections by the bumps 12. Further, the surface of the base board 11 opposite to the surface connected to the semiconductor chip 10a is formed with solder or other bumps 14 for connection to a mother board. The bumps 14 are connected to the bumps 12 connecting the electrode pads of the semiconductor chip 10a and the base board 11 via not shown through holes or other interconnections formed in the base board 11. Due to these, a semiconductor device 100 of a CSP format is formed.

A mother board 2 for mounting the above semiconductor device 100 has lands (electrodes) 21 formed at positions corresponding to the positions of formation of the bumps 14 of the semiconductor device 100 to be mounted on the top surface of a board 20 made of, for example, a glass epoxy-based material and a not shown printed circuit formed on a front surface, on a back surface or on both surfaces of the board 20 connected to the lands 21. The semiconductor device 100 is mounted on the mother board 2 by facing the bump forming surface of the semiconductor device 100 to the land forming surface of the mother board 2 while aligning the corresponding lands 21 and bumps 14, and, as shown in FIG. 1B, by using a method of making the bumps 14 reflow etc., the semiconductor device 100 and the lands 21 of the mother board 2 are connected mechanically and electrically via the bumps 14.

The above semiconductor device 100 has the base board (interposer) 11 acting as a buffer between the semiconductor chip 10a and the mother board 2, but research and development for a CSP of a format applying packaging at a wafer level without using the above base board (interposer) are now being actively carried out for a further reduction of size, lowering of cost, and improvement of processing speed of electronic circuits.

An explanation will be made next of a semiconductor device of a CSP format not using the above base board (interposer) and the method for mounting it. For example, as shown in the sectional view of FIG. 2A, solder or other bumps 12 are formed connected to not illustrated electrode pads of the semiconductor device 10a. The surface of the semiconductor chip 10a in the space between the bumps 12 is sealed by a resin coating 15. By this, a semiconductor device 1 of a CSP format is formed. On the other hand, the mother board 2 for mounting the semiconductor device 1 has the lands (electrodes) 21 and a not illustrated printed circuit on the top surface of board 20 made of for example a glass epoxy-based material in the same way as the above description. The above semiconductor device 1 is mounted on the mother board 2 by facing the bump forming surface of the semiconductor device 1 to the land forming surface of the mother board 2 while aligning the corresponding lands 21 and bumps 12, and, as shown in FIG. 2B, by using a method of making the bumps 12 reflow etc., the semiconductor device 1 and the lands 21 of the mother board 2 are connected mechanically and electrically via the bumps 12.

An explanation will be made next of the method of production of the above semiconductor device 1 of the CSP format by referring to the drawings. First, as shown in FIG. 3A, solder or other bumps 12a are formed on the semiconductor wafer 10 on which the circuit pattern of the semiconductor chip is formed so as to be connected to the circuit pattern of the semiconductor chip.

Next, as shown in FIG. 3B, the entire semiconductor wafer 10 is dipped in a molten resin to form a resin coating 15 on the bump forming surface of the semiconductor wafer 10 at a thickness that completely buries the bumps 12a while sealing the spaces between the bumps 12a. Here, with the method of dipping in a molten resin (dipping method), the resin coating 15 is formed on both surfaces of the semiconductor wafer 10.

Next, as shown in FIG. 4A, the resin coating 15 is ground from the top of the bump forming surface of the semiconductor wafer 10 to reduce its thickness until parts of the bumps 12a are exposed.

Next, as shown in FIG. 4B, solder balls 12b are transferred connected to the bumps 12a. The bumps 12 are constituted by the bumps 12a and the solder balls 12b.

Next, as shown in FIG. 4C, the semiconductor wafer 10 is cut (dicing step) along cutting lines comprised of regions between the circuit patterns of the semiconductor chips formed on the semiconductor wafer 10 and giving cutting margins of the semiconductor wafer 10 so as to divide it into semiconductor devices 1 of the CSP format each having cut semiconductor chips 10a and unnecessary parts 3 comprised of the outer periphery of the semiconductor wafer 10 not having complete circuit patterns.

The semiconductor device 1 produced by the above method of production can be mounted on the mother board as it is after dicing the semiconductor wafer 10, and enables a reduction of costs and a shortening of a delivery compared with conventional semiconductor devices using a base board (interposer).

In the above method of production of a semiconductor device, however, it is difficult to cut the semiconductor wafer accurately in position along the cutting lines serving as the cutting margin on the semiconductor wafer. This is because if a resin coating is formed with respect to a semiconductor wafer 10 which has circuit patterns as shown in for example FIG. 5A and the bumps 12 connected to the patterns and in which the regions between adjoining circuit patterns become the cutting lines 16, as shown in FIG. 5B, the cutting lines 16 formed by the regions between adjoining circuit patterns will end up being covered over the entire region on the semiconductor wafer 10, therefore even if trying to cut the semiconductor wafer along the cutting lines $X_1$ to $X_4$ and $Y_1$ to $Y_6$ in this state, it is no longer possible to confirm the positions of the cutting lines. Further, it is also difficult to confirm if the cut positions are actually along the cutting lines, so correct management becomes difficult in quality control of the process of manufacture of the semiconductor device.

SUMMARY OF THE INVENTION

The present invention was made in consideration with the above problem. The present invention has as its object to provide a method of production of a semiconductor device of a package format comprised of a semiconductor chip having bumps on its surface with spaces between bumps on the bump forming surface sealed by a resin, wherein it is possible to cut a semiconductor wafer accurately aligned with cutting lines forming cutting margins on the semiconductor wafer in the dicing step for producing the semiconductor device.

To achieve the above object, the method of production of a semiconductor device of the present invention provides a method of production of a semiconductor device of a package format comprised of a semiconductor chip having bumps on its surface with spaces between bumps on the bump forming surface sealed by a resin, comprising a step of forming, on a semiconductor wafer having a first region and a second region, formed with a circuit pattern of the semiconductor chip at least at the first region, and formed with cutting lines between semiconductor chips extending across the first region and second region, bumps at least at the first region so as to connect to the circuit pattern of the semiconductor chip, a step of forming a resin coating on the bump forming surface of the semiconductor wafer at the first region at a predetermined thickness while sealing the spaces between the bumps and at a region containing at least a part of the cutting line in the second region at a thickness enabling confirmation of a position of the part of the cutting line, and a step of cutting the semiconductor wafer along the cutting lines using as a reference position the cutting line confirmed at the region containing the part of the cutting line in the second region.

According to the method of production of a semiconductor device of the present invention, on a semiconductor wafer having a first region and a second region, formed with circuit patterns of semiconductor chips at least at the first region, and formed with cutting lines between semiconductor chips extending across the first region and the second region, bumps are formed so as to connect to the circuit patterns of the semiconductor chips in at least the first region. Next, a resin coating is formed on the bump forming surface of the semiconductor water at the first region to a predetermined thickness while sealing the spaces between the bumps and at the region including at least a part of the cutting line in the second region at a thickness enabling confirmation of a position of the part of the cutting line. Next, the semiconductor wafer is cut along the cutting lines using as a reference position the cutting line confirmed at the region containing the part of the cutting line in the second region.

According to the method of production of a semiconductor device of the present invention, since the resin coating is formed on the bump forming surface of the semiconductor wafer at the first region to the predetermined thickness while sealing the spaces between the bumps and at the region containing at least the part of the cutting line in the second region at the thickness enabling confirmation of the position of the part of the cutting line, when cutting the semiconductor wafer in a later step, it is possible to confirm the position of the cutting line at the region containing at least the part of the cutting line in the second region and possible to cut the semiconductor wafer accurately positioned to the cutting lines giving the cutting margins on the semiconductor wafer.

The above method of production of a semiconductor device of the present invention preferably has the first region made a region of a center of the semiconductor wafer and has the second region made a region of an outer periphery of the semiconductor wafer. Since the resin coating is formed thin on at least the part of the second region, the region ends up being unusable for a semiconductor device, but since the region at the outer periphery of the semiconductor wafer originally does not have complete circuit patterns and is unnecessary, that region can be used as the second region.

The above method of production of a semiconductor device of the present invention preferably has the step of forming a resin coating on the bump forming surface of the semiconductor wafer including a step of forming a resin coating at a predetermined thickness at the first region and the second region and a step of reducing the thickness of the resin coating at the region containing at least the part of the cutting line in the second region to the thickness enabling confirmation of the position of the part of the cutting line. Even if formed thick at the second region, it is possible to reduce the thickness to enable the position of the part of the cutting line to be confirmed.

The above method of production of a semiconductor device of the present invention preferably has, in the step of forming a resin coating at a predetermined thickness in the first region and the second region, the resin coating formed by immersing the semiconductor wafer in a molten resin. Due to this, it is possible to form the resin coating at a predetermined thickness at the first region and the second region.

The above method of production of a semiconductor device of the present invention preferably has, in the step of forming the resin coating on the bump forming surface of the semiconductor wafer, the resin coating formed using a mold designed to give the predetermined thickness at the first region and to give the thickness enabling confirmation of the position of the part of the cutting line at the region containing at least the part of the cutting line in the second region. Due to this, it is possible to form a thin film enabling the position of the part of the cutting line to be confirmed at the second region.

The above method of production of a semiconductor device of the present invention preferably has, in the step of forming the resin coating on the bump forming surface of the semiconductor wafer, the resin coating formed to give a thickness of not more than 30 μm at the region containing at least the part of the cutting line in the second region. Due to this, it is possible to give a thickness enabling the position of the part of the cutting line to be confirmed.

The above method of production of a semiconductor device of the present invention preferably has, in the step of forming the resin coating on the bump forming surface of the semiconductor wafer, the resin coating formed at a thickness for completely burying the bumps in the first region and, before the step of cutting the semiconductor wafer, further has a step of reducing the thickness of the resin coating until at least parts of the bumps are exposed at the first region. Due to this, parts of the bumps become exposed and can be electrically connected to when mounting on a mother board.

The above method of production of a semiconductor device of the present invention preferably has, in the step of cutting the semiconductor wafer, an image of the semiconductor wafer taken and processed on a computer to confirm the position of the cutting line. Along with the increasing reduction of the design rule of semiconductor devices from for example 0.35 μm to 0.25 μm or 0.18 μm, the widths of cutting lines between semiconductor chips have become smaller and difficult to confirm visually. Even so, it is possible to confirm the position of cutting line reliably by image processing on a computer.

BRIEF DESCRIPTION OF THE DRAWINGS

These and other objects and features of the present invention will become clearer from the following description of the preferred embodiments given with reference to the accompanying drawings, in which:

FIGS. 1A to 1B are sectional views for explaining the semiconductor device according to the first related art and the method of mounting the same to the mother board, in which FIG. 1A shows the state up to the step of mounting the semiconductor device to the mother board and FIG. 1B shows the state up to the reflow step;

FIGS. 2A to 2B are sectional views for explaining the semiconductor device according to the second related art and the method of mounting the same to the mother board, in which FIG. 2A shows the state up to the step of mounting the semiconductor device to the mother board and FIG. 2B shows the state up to the reflow step;

FIGS. 3A to 3B are sectional views of steps of a method of production of a semiconductor device according to the second related art, in which FIG. 3A shows the state up to the step for forming the bumps and FIG. 3B shows the state up to the step for forming the resin coating;

FIGS. 4A to 4C are steps continuing from FIGS. 3A to 3B, in which

FIG. 4A shows the state up to the step for reducing the thickness of the resin coating, FIG. 4B shows the state up to the transfer step of the solder balls to the bumps, and FIG. 4C shows the state up to a step for cutting the semiconductor wafer along the cutting lines;

FIGS. 5A to 5B are perspective views of the semiconductor wafer in steps of the method of production of a semiconductor device according to the second related art, in which FIG. 5A shows the state after the step of forming the bumps and FIG. 5B shows the state after the step for forming the resin coating;

FIGS. 6A to 6B are sectional views for explaining a semiconductor device according to a first embodiment and a method of mounting the same to a mother board, in which FIG. 6A shows the state up to a step of mounting the semiconductor device to the mother board and FIG. 6B shows the state up to a reflow step;

FIGS. 7A to 7C are sectional views of steps of a method of production of a semiconductor device according to the first embodiment, in which FIG. 7A shows the state up to a step for forming bumps, FIG. 7B shows the state up to a step for forming a resin coating, and FIG. 7C shows a state up to a step for reducing the thickness of the resin coating in the parts of the second region;

FIGS 8A to 8C are steps continuing from FIGS. 7A to 7C, in which

FIG. 8A shows the state up to a step for reducing the thickness of the resin coating in the first region, FIG. 8B shows the state up to a transfer step of solder balls to the bumps, and FIG. 8C shows the state up to a step for cutting a semiconductor wafer along cutting lines;

FIGS 11A to 11C are sectional views of steps of a method of production of a semiconductor device according to a second embodiment, in which FIG. 11A shows the state up to a step for forming bumps, FIG. 11B shows the state up to a step for placing the semiconductor wafer on a mold, and FIG. 11C shows the state up to the step for forming the resin coating; and FIGS. 12A to 12C are steps continued to FIGS. 11A to 11C, in which FIG. 12A shows up to the step for reducing the thickness of the resin coating in the first region, FIG. 12B shows up to the transfer step of the solder ball to the bump, and FIG. 12C shows up to the step for cutting the semiconductor wafer along the cutting line.

DESCRIPTION OF THE PREFERRED EMBODIMENTS

Figure 1A:
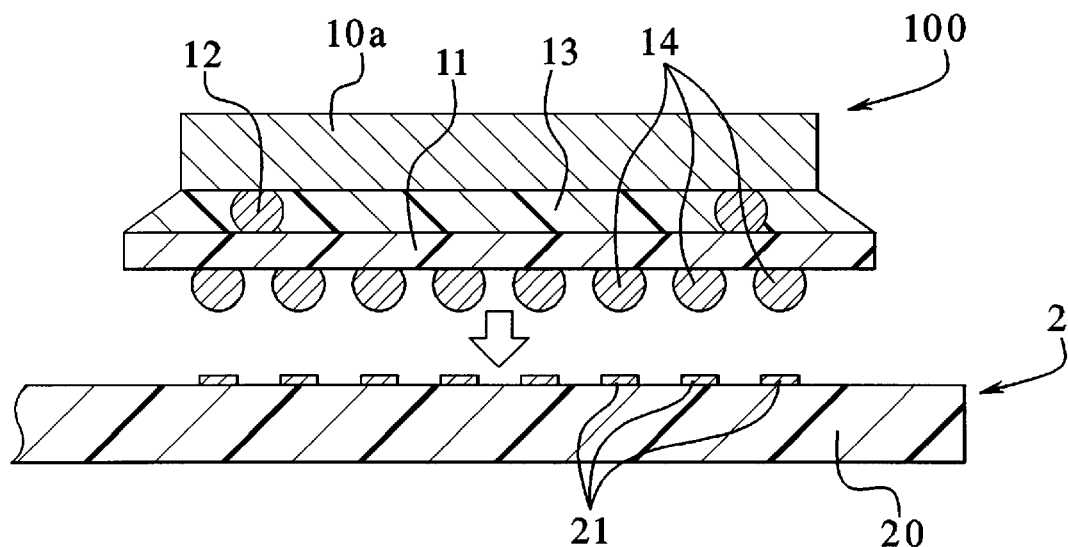
Figure 1B:
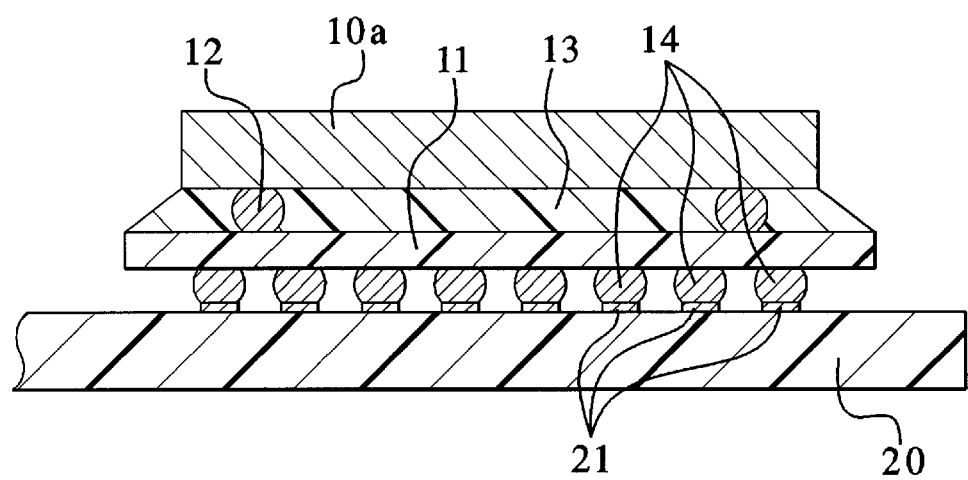
Figure 2A:
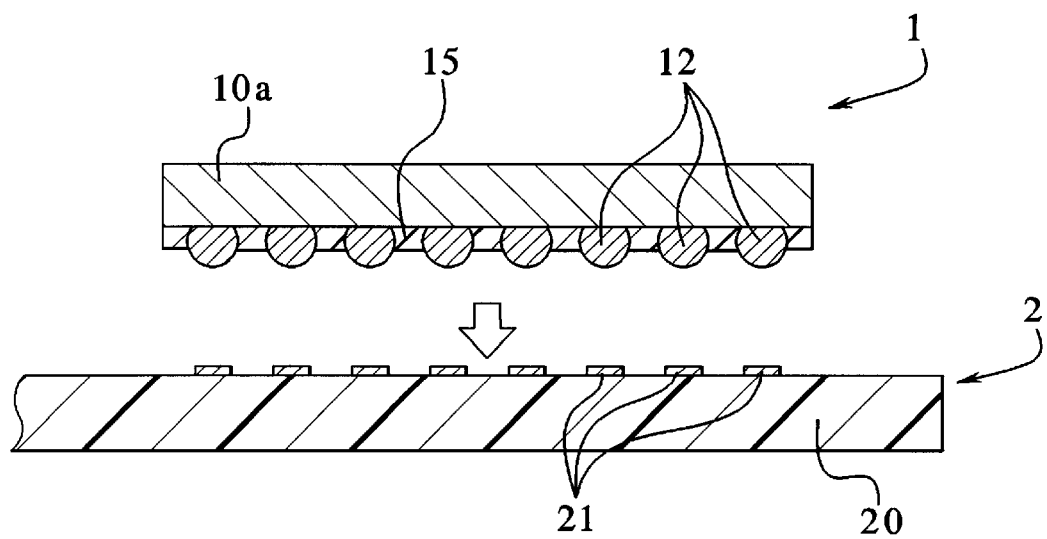
Figure 2B:
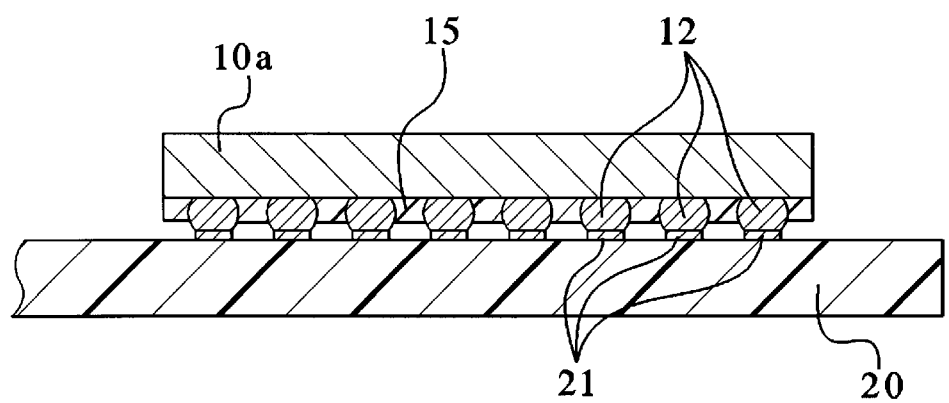
Figure 3A:
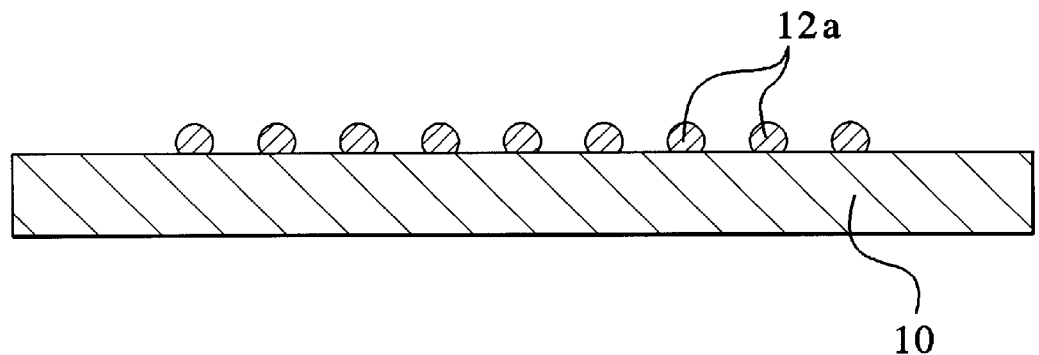
Figure 3B:
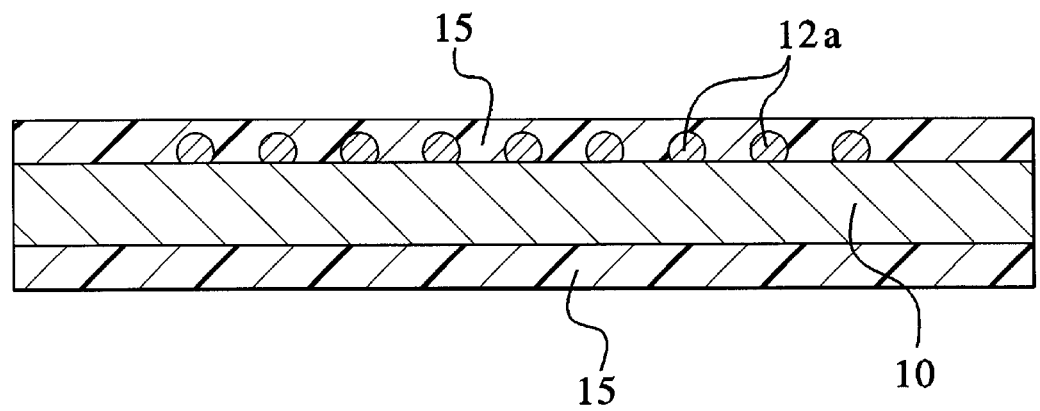
Figure 4A:
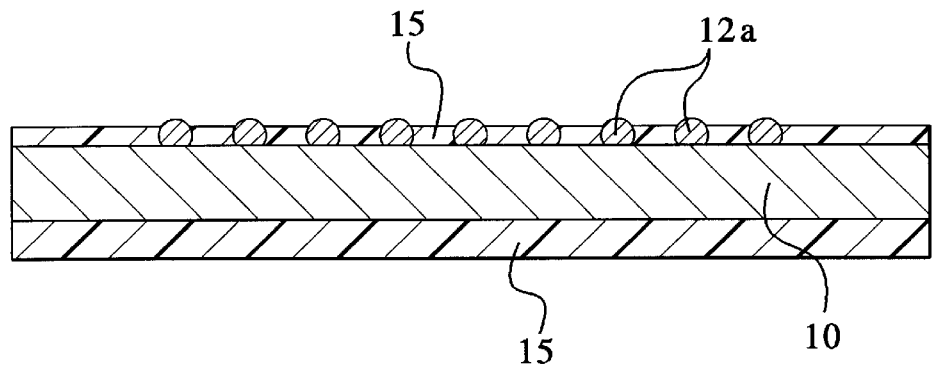
Figure 4B:
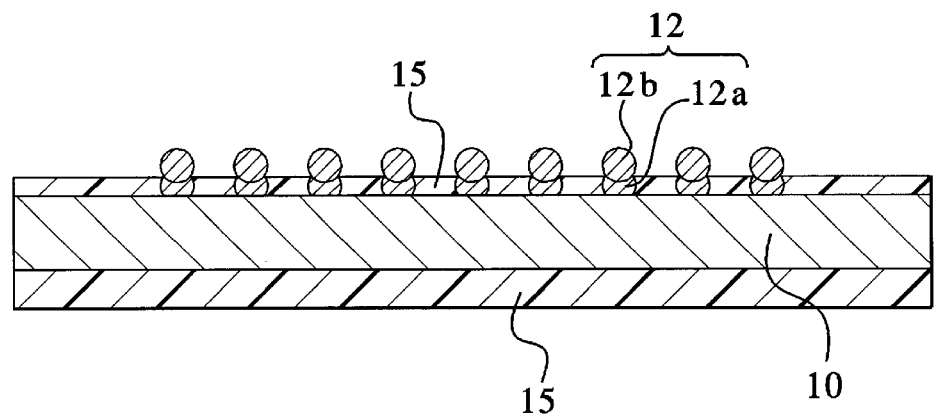
Figure 4C:
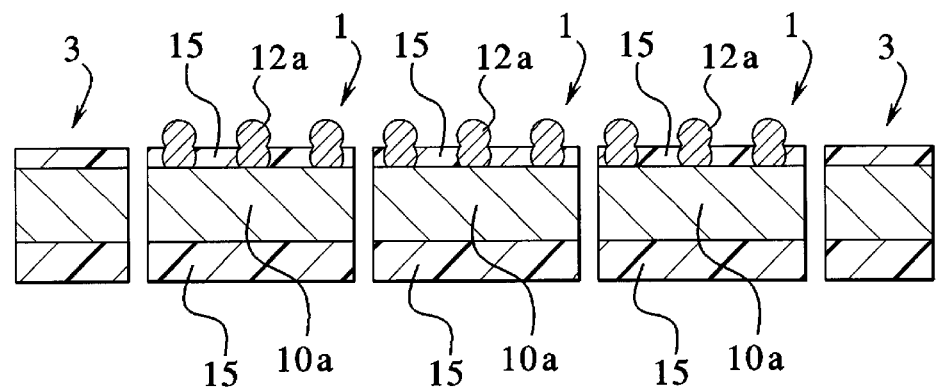
Figure 5A:
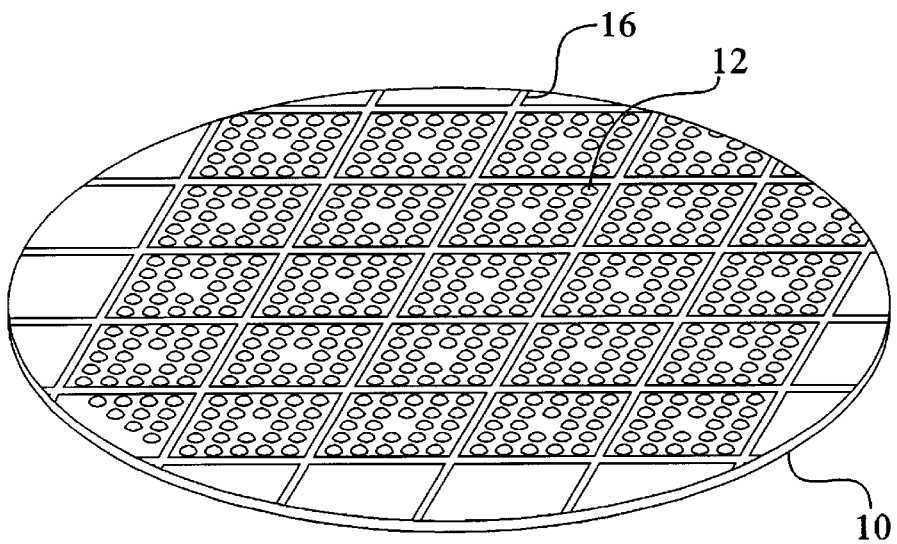
Figure 5B:
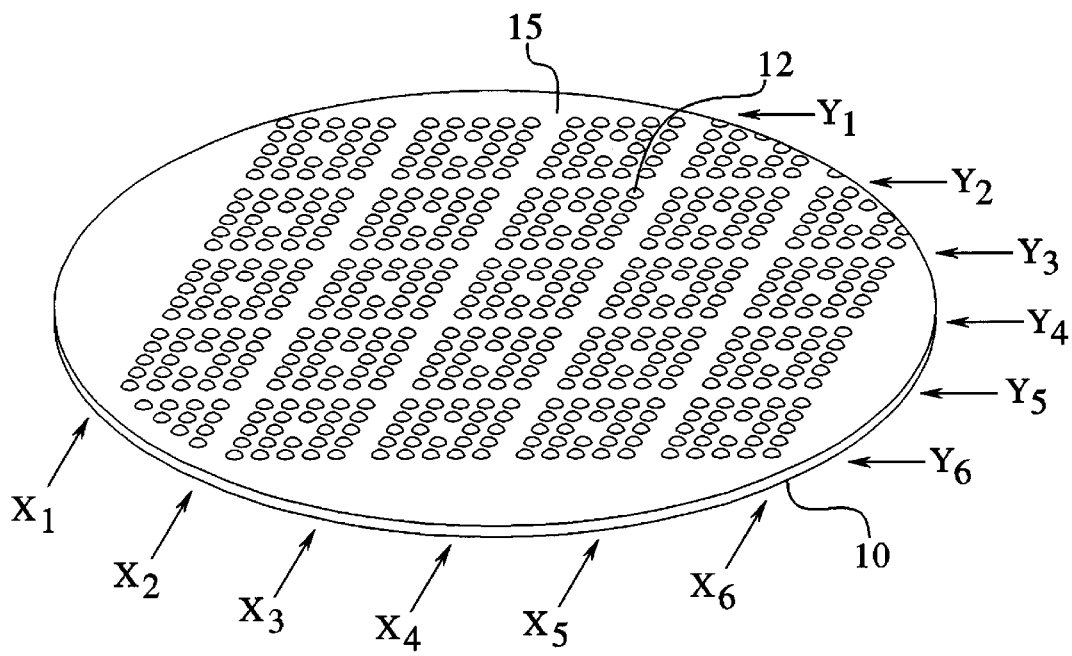

Below, an explanation will be made of embodiments of the method of production of a semiconductor device of the present invention by referring to the drawings.

First Embodiment

Figure 6A:
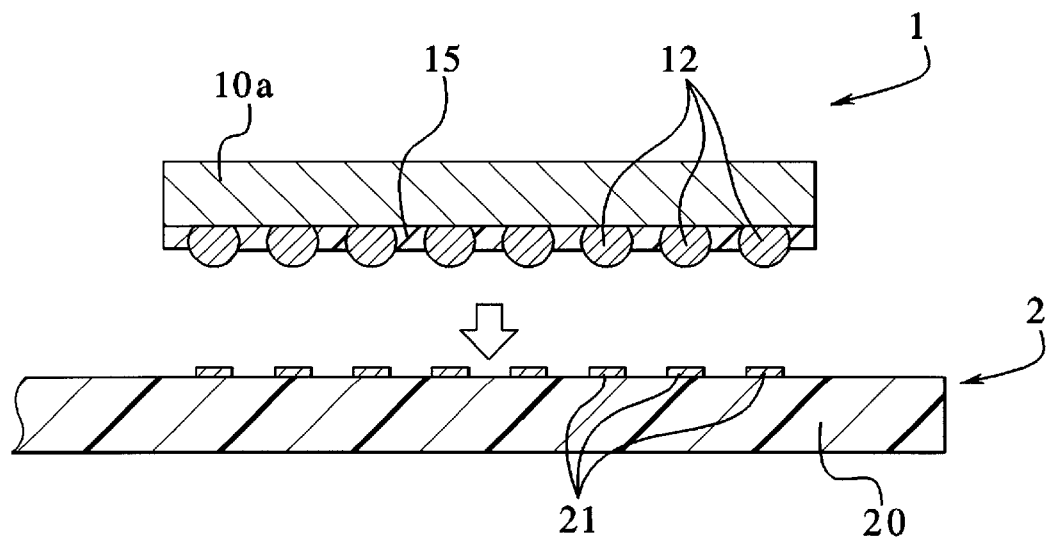

The semiconductor device according to the present embodiment, as shown in the sectional view of FIG. 6A, is formed with solder or other bumps 12 connected to not illustrated electrode pads of a semiconductor chip 10a. The surface of the semiconductor chip 10a in the spaces between the bumps 12 is sealed by the resin coating 15. The surface of the semiconductor chip 10a at the side opposite to the bump 12 forming surface may also be covered by the resin coating. Due to this, a semiconductor device 1 of a CSP format is formed.

Figure 6B:
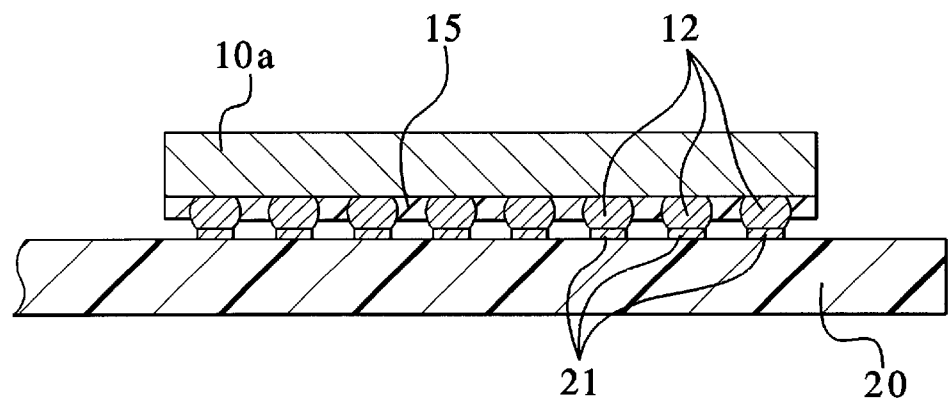

The mother board 2 for mounting the semiconductor device 1, as shown in FIG. 6A, is comprised of a board 20 made of for example a glass epoxy-based material on the top of which are provided lands (electrodes) 21 and a not illustrated printed circuit. The semiconductor device 1 is mounted on the mother board 2 by facing the bump forming surface of the semiconductor device 1 to the land forming surface of the mother board 2 while aligning the corresponding lands 21 and bumps 12, and, as shown in FIG. 6B, by using a method of making the bumps 12 reflow etc., the semiconductor device 1 and the lands 21 of the mother board 2 are connected mechanically and electrically via the bumps 12.

Figure 7A:
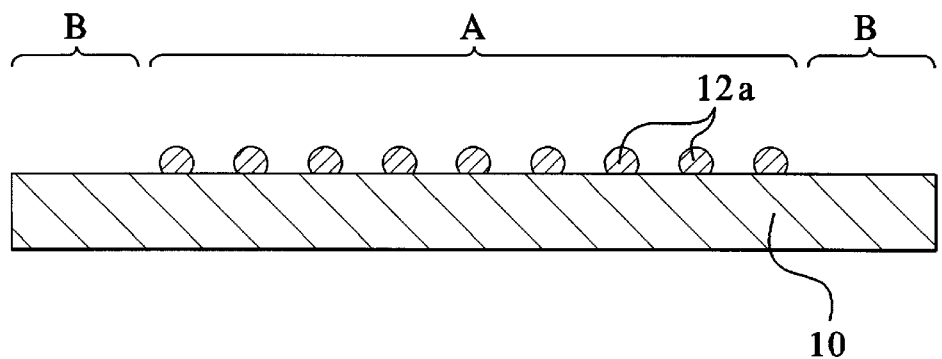

An explanation will be made next of the method of production of the semiconductor device 1 of the CSP format by referring to the drawings. First, as shown in FIG. 7A, circuit patterns (not illustrated) of semiconductor chips and the cutting lines (not illustrated) between semiconductor chips are formed on the semiconductor wafer 10. Here, the region at the center of the semiconductor wafer 10 on which complete circuit patterns of the semiconductor chips are formed is defined as the first region A, while the region at the outer periphery of the semiconductor wafer 10 which does not have complete circuit patterns and is unnecessary is defined as the second region B. The cutting lines between the semiconductor chips are formed extending across the first region A to the second region B. Next, solder, gold or other bumps 12a are formed in at least the first region A by a vapor deposition process or a transfer process etc. so as to connect to the circuit patterns of the semiconductor chips.

Figure 7B:
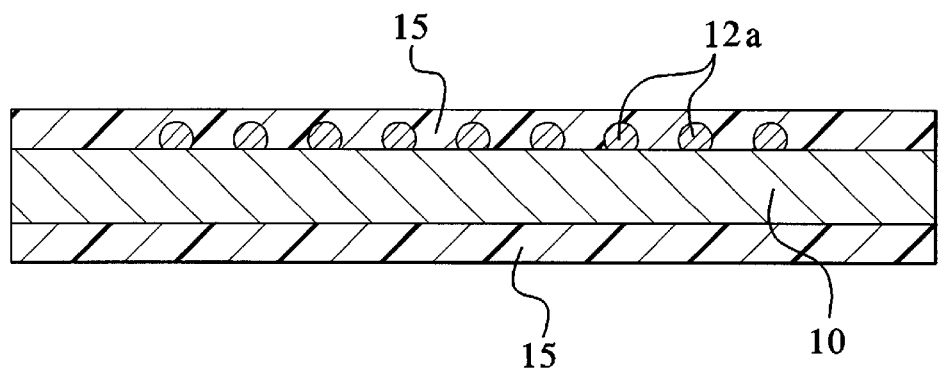

Next, as shown in FIG. 7B, the entire semiconductor wafer 10 is dipped in molten resin to seal the spaces between the bumps 12a in the first region A and form the resin coating 15 on the bump 12a forming surface of the semiconductor wafer 10 in the first region A and the second region B to a thickness completely burying the bumps 12a. Here, with he method of dipping in molten resin (dipping process), the resin coating 15 is formed on both surfaces of the semiconductor wafer 10, but it is not always necessary to form the resin coating of the back surface opposite to the bump 12a forming surface.

Figure 7C:
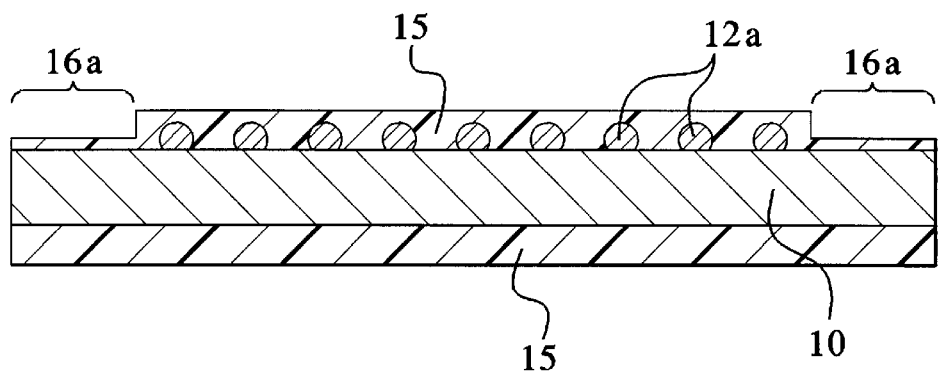

Next, as shown in FIG. 7C, the resin coating 15 is reduced in thickness to an extent enabling confirmation of the positions of parts of the cutting lines in the regions containing at least the parts of the cutting lines in the second region B. In the thin film region 16a of part of the second region B, the thickness of the resin coating 15 becomes for example 20 to 30 μm. The patterns underneath the resin coating can be seen through this, therefore the positions of parts of the cutting lines can be confirmed.

Figure 8A:
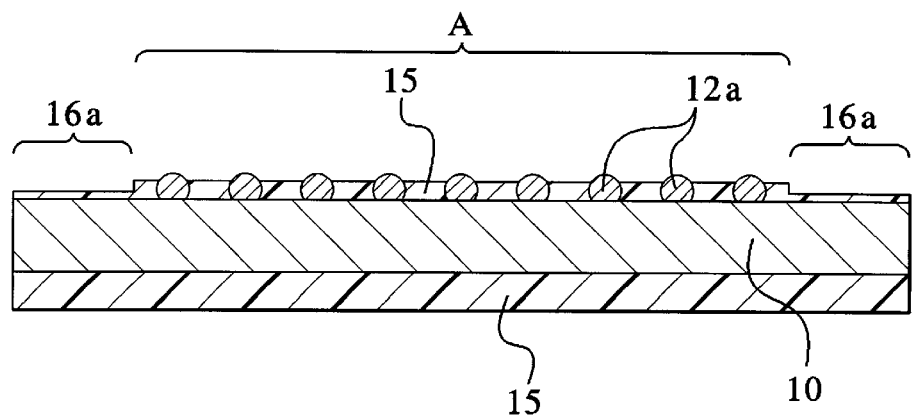

Next, as shown in FIG. 8A, in the first region A, the resin coating 15 is ground to reduce it in thickness until at least parts of the bumps 12a are exposed.

Figure 8B:
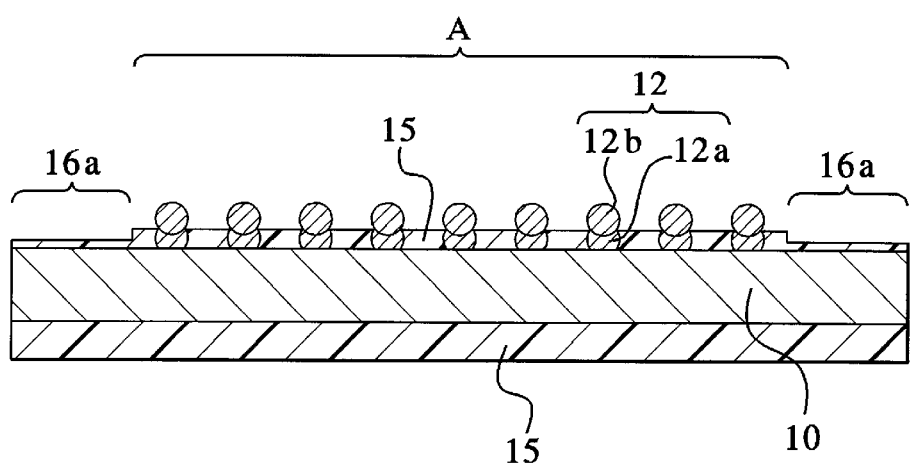

Next, as shown in FIG. 8B, in the first region A, solder balls 12b are transferred connected to the bumps 12a. The bumps 12 are constituted by the bumps 12a and the solder balls 12b.

Figure 8C:
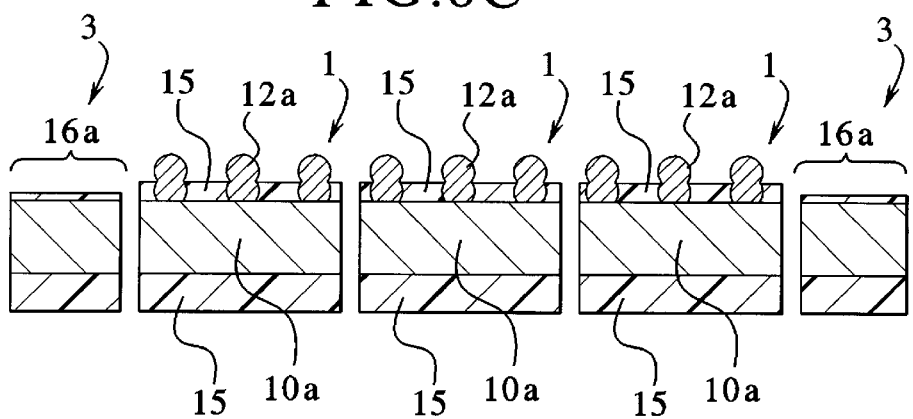

Next, as shown in FIG. 8C, the semiconductor wafer 10 is cut (dicing step) along the cutting lines comprised of the regions between circuit patterns of the semiconductor chips formed on the semiconductor wafer 10 in the first region A and the second region B and giving cutting margins of the semiconductor wafer 10 to divide it into semiconductor devices 1 of the CSP format each having cut semiconductor chips 10a and an unnecessary part 3 comprised of the outer periphery of the semiconductor wafer 10 which does not have complete circuit patterns. Here, in cutting the semiconductor wafer 10 along the cutting lines, the positions of the cutting lines are visually confirmed from the underlying patterns seen through the thin resin coating 15 or an image of the semiconductor wafer 10 is taken by a CCD camera or the like and the obtained image is processed on a computer to confirm the positions of the cutting lines and then the semiconductor wafer 10 is cut along the cutting lines using as reference positions the confirmed cutting lines.

Figure 9:
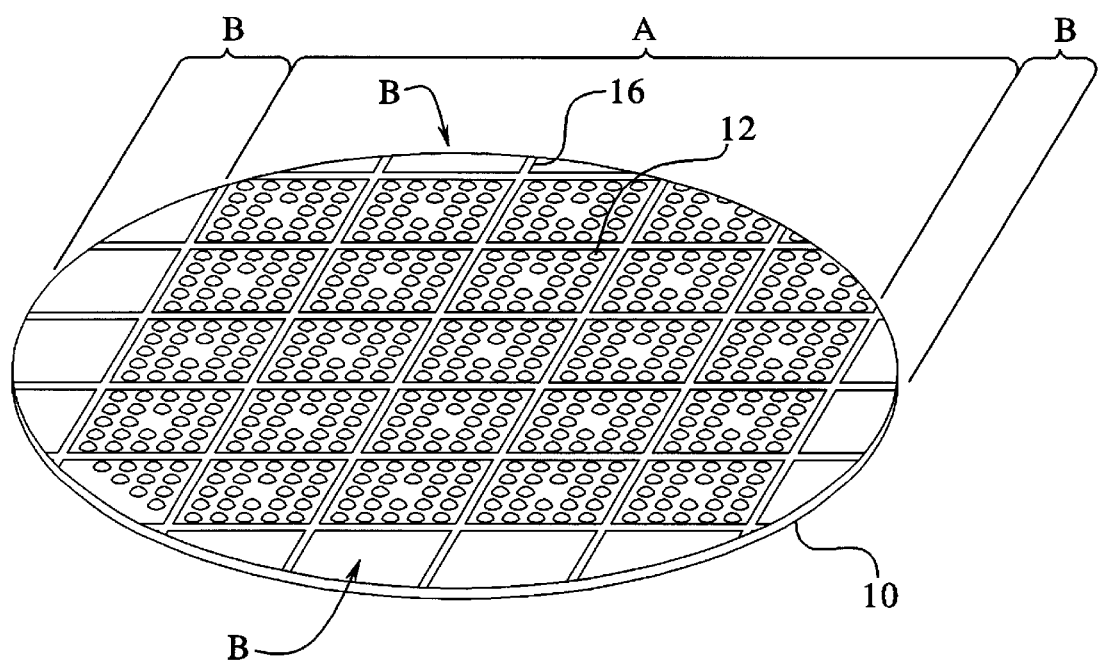
FIG. 9 is a perspective view of the semiconductor wafer after the step for forming the bumps in the steps of the method of production of the semiconductor device according to the first embodiment.
Figure 10:
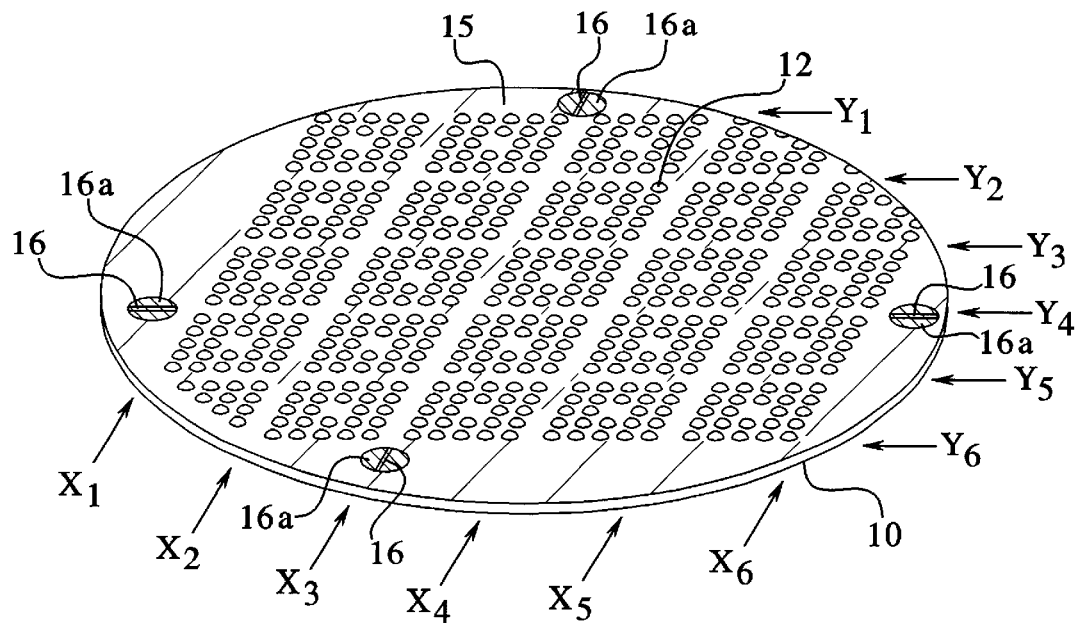
FIGS. 10A to 10B are perspective views of the semiconductor wafer after the step for forming thin regions in the parts of the second region in the steps of the method of production of a semiconductor device according to the first embodiment.
Figure 10:
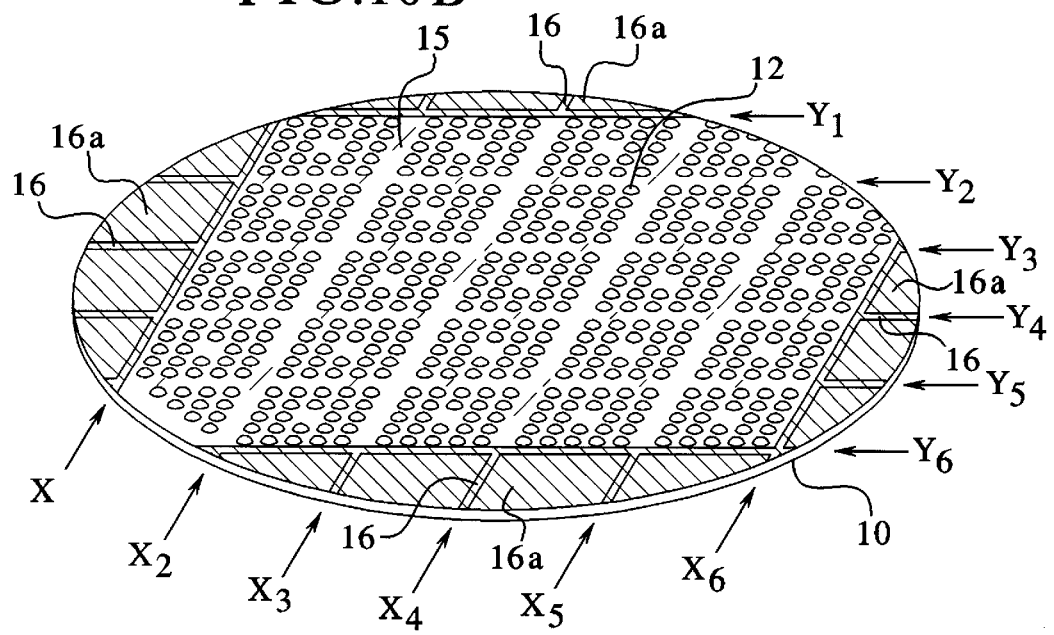

In the above method of production of the semiconductor device, the resin coating 15 is formed on a semiconductor wafer 10 which has the circuit patterns as shown in for example FIG. 9 and the bumps 12 connecting to the patterns and in which the regions between adjoining circuit patterns become the cutting lines 16, but as shown in FIG. 10A or FIG. 10B, by reducing the thickness of the resin coating 15 to a thickness enabling confirmation of the positions of parts of the cutting lines in the regions containing parts of the cutting lines in the region which does not have complete circuit patterns on the semiconductor wafer 10 and becomes unnecessary (for example, as shown in FIGS. 10A and 10B, four portions are selected from the semiconductor wafer), the underlying patterns of the resin coating can be seen through it in thin film regions 16a, so the positions of the cutting lines 16 can be confirmed and, when cutting the semiconductor wafer 10 along the cutting lines of $X_1$ to $X_6$ and $Y_1$ to $Y_6$, the semiconductor wafer 10 can be cut accurately positioned to the cutting lines 16 giving the cutting margins on the semiconductor wafer 10.

Second Embodiment

The semiconductor device according to the present embodiment is substantially the same as the semiconductor device according to the first embodiment, so an explanation will be omitted.

Figure 11A:
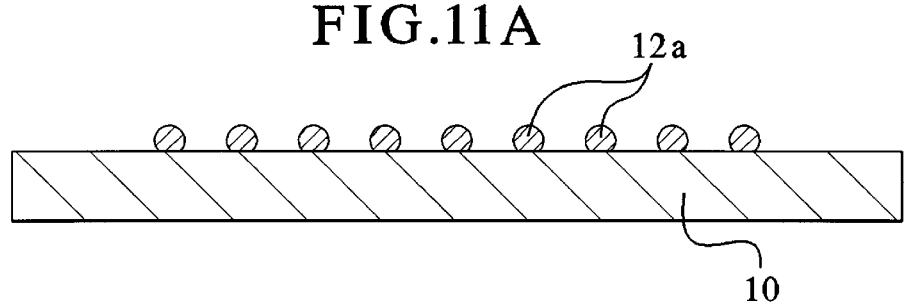

An explanation will be made of the method of production of a semiconductor device according to the present embodiment by referring to the drawings. First, as shown in FIG. 11A, circuit patterns (not illustrated) of the semiconductor chips and the cutting lines (not illustrated) between semiconductor chips are formed on the semiconductor wafer 10. Here, the region at the center of the semiconductor wafer 10 on which the complete circuit patterns of the semiconductor chips are formed is defined as the first region A, while the region on the outer periphery of the semiconductor wafer 10 which does not have the complete circuit patterns and becomes unnecessary is defined as the second region B. The cutting lines between the semiconductor chips are formed extending across an area from the first region A to the second region B. Next, solder or gold or other bumps 12a are formed in at least the first region A by a vapor deposition process or a transfer process etc. so as to be connected to the circuit patterns of the semiconductor chips.

Figure 11B:
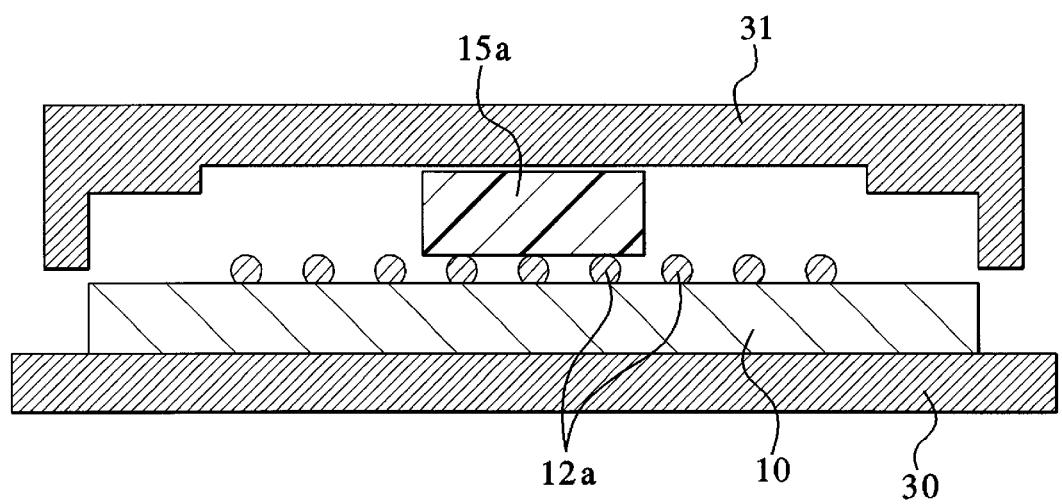
Figure 11C:
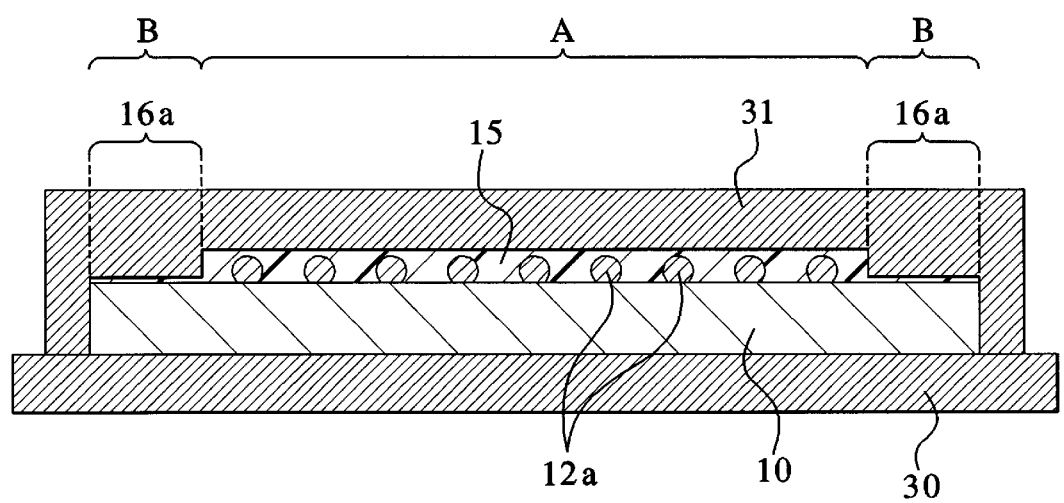

Next, as shown in FIG. 11B, the semiconductor wafer is placed on a first mold 30, then a resin tablet 15a is placed over this. A second mold 31 is pressed against this from above, the tablet-shaped resin is melted and then made to resolidify in the first region A while sealing the spaces between the bumps 12a, and thereby the resin coating 15 is formed on the bump 12a forming surface of the semiconductor wafer 10. Here, by using a pair of the first mold 30 and second mold 31 selected to give a thickness completely burying the bumps 12a in the first region A of the semiconductor wafer 10 and to give a thickness enabling confirmation of the positions of the parts of the cutting lines in the regions containing at least the parts of the cutting lines in the second region B, as shown in FIG. 11C, the thickness of the resin coating 15 in the thin regions 16a constituting the parts of the second region B can be made to 20 to 30 µm and the underlying patterns of the resin coating can be seen through it, therefore the positions of the parts of the cutting lines can be confirmed.

Figure 12A:
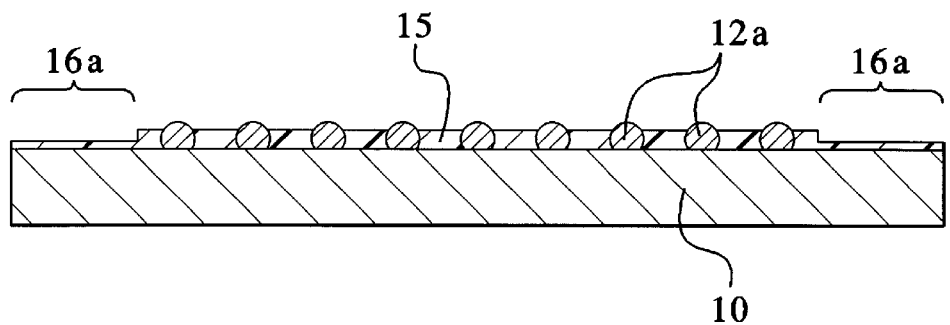

Next, as shown in FIG. 12A, in the first region A, the resin coating 15 is ground to reduce the thickness until at least parts of the bumps 12a are exposed.

Figure 12B:
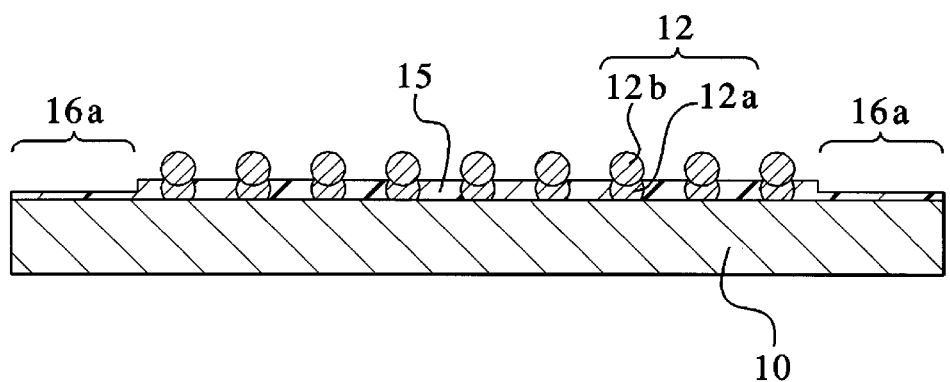

Next, as shown in FIG. 12B, in the first region A, solder balls 12b are transferred connected to the bumps 12a. The bumps 12 are constituted by the bumps 12a and the solder balls 12b.

Figure 12C:
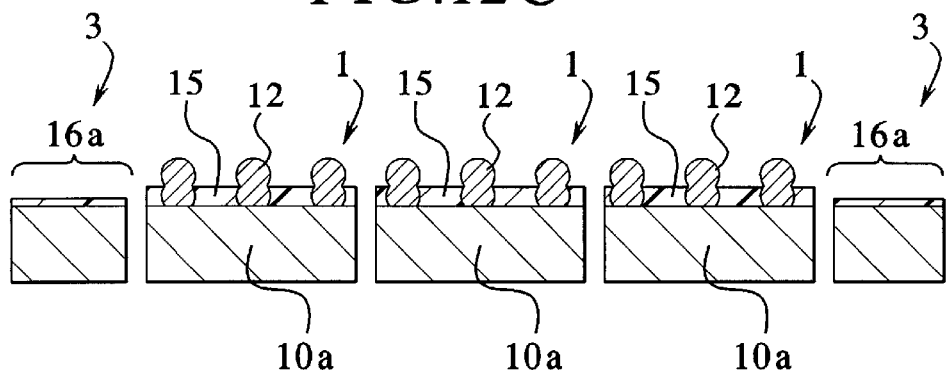

Next, as shown in FIG. 12C, the semiconductor wafer 10 is cut (dicing step) along the cutting lines comprised of the regions between circuit patterns of the semiconductor chips formed on the semiconductor wafer 10 in the first region A and the second region B and giving cutting margins of the semiconductor wafer 10 to divide it into semiconductor devices 1 of the CSP format each having cut semiconductor chips 1a and an unnecessary part 3 comprised of the outer periphery of the semiconductor wafer 10 which does not have complete circuit patterns. Here, in cutting the semiconductor wafer 10 along the cutting lines, the positions of the cutting lines are visually confirmed from the underlying patterns seen through the thin resin coating 15 or an image of the semiconductor wafer 10 is taken by a CCD camera or the like and the obtained image is processed on a computer to confirm the positions of the cutting lines and then the semiconductor wafer 10 is cut along the cutting lines using as reference positions the confirmed cutting lines.

In the above method of production of the semiconductor device, like in the first embodiment, the underlying patterns of the resin coating can be seen through it in thin film regions 16a, so the positions of the cutting lines 16 can be confirmed and, when cutting the semiconductor wafer 10 along the cutting lines of $X_1$ to $X_6$ and $Y_1$ to $Y_6$, the semiconductor wafer 10 can be cut accurately positioned to the cutting lines 16 giving the cutting margins on the semiconductor wafer 10. As the thin regions formed by using the molds, the pattern as shown in FIG. 10A or FIG. 10B can be used.

The semiconductor device of the present invention can be applied to MOS transistor type semiconductor devices, bipolar semiconductor devices, BiCMOS semiconductor devices, semiconductor devices carrying logics and memories, and any other semiconductor devices.

The semiconductor device of the present invention is not limited to the above embodiments. For example, when reducing the thickness of the resin coating in the second region so that the cutting lines can be confirmed, it is acceptable even if the resin coating ends up being completely removed in the thin regions. It is also possible to form the resin coating to a thickness such that parts of the bumps are exposed from the first. Other than this, various modifications are possible within a range not out of the gist of the present invention.

As described above, according to the method of production of a semiconductor device of the present invention, since the resin coating is formed on the bump forming surface of the semiconductor wafer to a predetermined thickness in the first region while sealing the spaces between the bumps and to a thickness enabling confirmation of the positions of the parts of the cutting lines in the regions containing at least the parts of the cutting lines in the second region, when cutting the semiconductor wafer in the latter step, it is possible to confirm the positions of the cutting lines in the regions containing at least the parts of the cutting lines in the second region and possible to cut the semiconductor wafer accurately positioned to the cutting lines giving the cutting margin on the semiconductor wafer.

While the invention has been described with reference to specific embodiment chosen for purpose of illustration, it should be apparent that numerous modifications could be made thereto by those skilled in the art without departing from the basic concept and scope of the invention.

What is claimed is:

1. A method of production of a semiconductor device, comprising:

presenting a semiconductor chip comprising a wafer that defines a first surface, a first region, and a second region, wherein the wafer comprises a cutting line pattern disposed on the first surface and wherein the cutting line pattern defines an image, the semiconductor chip further comprising a plurality of bumps patterned on the first surface of the wafer in the first region; and disposing resin on the first surface of the wafer so as to visibly obscure a first portion of the cutting line pattern image in at least one of the first region and the second region and to visibly reveal a second portion of the cutting line pattern image in at least one of the first region and the second region.

2. A method of production of a semiconductor device as set forth in claim 1, wherein the first region is located in a center of the wafer and the second region is located about the center of the semiconductor wafer.

3. A method of production of a semiconductor device as set forth in claim 2, wherein disposing resin on the first surface of the wafer comprises forming a resin coating having a first thickness in the first region and the second region, and reducing the first thickness of the resin coating in the second region to a second thickness that is less than the first thickness so as to visibly reveal the second portion of the cutting line pattern image in the second region.

4. A method of production of a semiconductor device as set forth in claim 3, wherein reducing the first thickness of the resin coating in the second region to a second thickness includes grinding the resin coating in the second region.

5. A method of production of a semiconductor device as set forth in claim 2, wherein disposing resin on the first surface of the wafer comprises introducing resin into a cavity defined by a surface of a mold and at least the first region of the wafer, and causing the resin to be disposed about the plurality of bumps at a first thickness and to be disposed in the second region at a second thickness to visibly reveal the second portion of the cutting line pattern image in the second region.

6. A method of production of a semiconductor device as set forth in claim 1, wherein the second thickness of the resin is less than 30 µm.

7. A method of production of a semiconductor device as set forth in claim 1, further comprising:

capturing into a usable form the second portion of the cutting line pattern image;

processing the usable form in a computer to generate a confirmed position of the visibly obscured, first portion of the cutting line pattern; and processing the semiconductor chip according to the confirmed position of the visibly obscured, first portion of the cutting line pattern.

8. A method of production of a semiconductor device as set forth in claim 1, wherein the second portion of the cutting line pattern image includes four portions.

* * * * *